(12) United States Patent
Cheng et al.

(10) Patent No.: US 9,799,557 B2
(45) Date of Patent: Oct. 24, 2017

(54) SEMICONDUCTOR DEVICE STRUCTURE WITH METAL RING ON SILICON-ON-INSULATOR (SOI) SUBSTRATE

(71) Applicant: Taiwan Semiconductor Manufacturing Co., Ltd., Hsin-Chu (TW)

(72) Inventors: Kuo-Yu Cheng, Tainan (TW); Wei-Kung Tsai, Tainan (TW); Kuan-Chi Tsai, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 99 days.

(21) Appl. No.: 14/161,208

(22) Filed: Jan. 22, 2014

(65) Prior Publication Data

US 2015/0206964 A1 Jul. 23, 2015

(51) Int. Cl.
| | | |
|---|---|---|
| *H01L 21/768* | (2006.01) | |
| *H01L 27/02* | (2006.01) | |
| *H01L 29/06* | (2006.01) | |
| *H01L 23/58* | (2006.01) | |
| *H01L 21/311* | (2006.01) | |
| *H01L 21/84* | (2006.01) | |
| *H01L 21/74* | (2006.01) | |

(52) U.S. Cl.
CPC .. *H01L 21/76877* (2013.01); *H01L 21/31144* (2013.01); *H01L 23/585* (2013.01); *H01L 27/0248* (2013.01); *H01L 29/0607* (2013.01); *H01L 21/743* (2013.01); *H01L 21/76816* (2013.01); *H01L 21/84* (2013.01); *H01L 2924/0002* (2013.01); *H01L 2924/14* (2013.01)

(58) Field of Classification Search
None
See application file for complete search history.

(56) References Cited

U.S. PATENT DOCUMENTS

| | | | | |
|---|---|---|---|---|
| 7,888,738 B2* | 2/2011 | Tessier | ............. | H01L 21/743 257/347 |
| 8,133,774 B2* | 3/2012 | Botula | ............. | H01L 21/76264 257/E27.112 |
| 8,188,574 B2* | 5/2012 | Angyal | ............. | H01L 23/562 257/347 |
| 2007/0013072 A1* | 1/2007 | Ellis-Monaghan | . | H01L 27/0248 257/758 |
| 2008/0171419 A1* | 7/2008 | Wen | ............. | H01L 21/743 438/412 |
| 2010/0237472 A1* | 9/2010 | Gillis | ............. | H01L 21/743 257/621 |
| 2012/0074515 A1* | 3/2012 | Chen | ............. | H01L 23/585 257/491 |

* cited by examiner

*Primary Examiner* — Andres Munoz

(74) *Attorney, Agent, or Firm* — Birch, Stewart, Kolasch & Birch, LLP

(57) ABSTRACT

In accordance with some embodiments, a semiconductor device is provided. The semiconductor device structure includes a substrate, and the substrate has a device region and an edge region. The semiconductor device structure also includes a silicon layer formed on the substrate and a transistor formed on the silicon layer. The transistor is formed at the device region of the substrate. The semiconductor device structure further includes a metal ring formed in the silicon layer. The metal ring is formed at the edge region of the substrate, and the transistor is surrounded by the metal ring.

18 Claims, 5 Drawing Sheets

SEMICONDUCTOR DEVICE STRUCTURE WITH METAL RING ON SILICON-ON-INSULATOR (SOI) SUBSTRATE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The implementation of silicon-on-insulator (SOI) technology is one of several manufacturing strategies employed to allow the continued miniaturization of microelectronic devices, which may be referred to as extending Moore's Law. Reported benefits of SOI technology relative to silicon (bulk complementary metal-oxide-semiconductor (CMOS)) processing may include, for example, lower parasitic capacitance due to isolation from the bulk silicon, which improves power consumption at matched performance, and resistance to latch-up due to isolation of the n- and p-well structures.

From a manufacturing perspective, SOI substrates are compatible with most fabrication processes. Indeed, an SOI-based process may be implemented without special equipment or significant retooling of an existing factory. Although existing devices and methods for forming the SOI-based process have been generally adequate for their intended purposes, they have not been entirely satisfactory in all respects.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
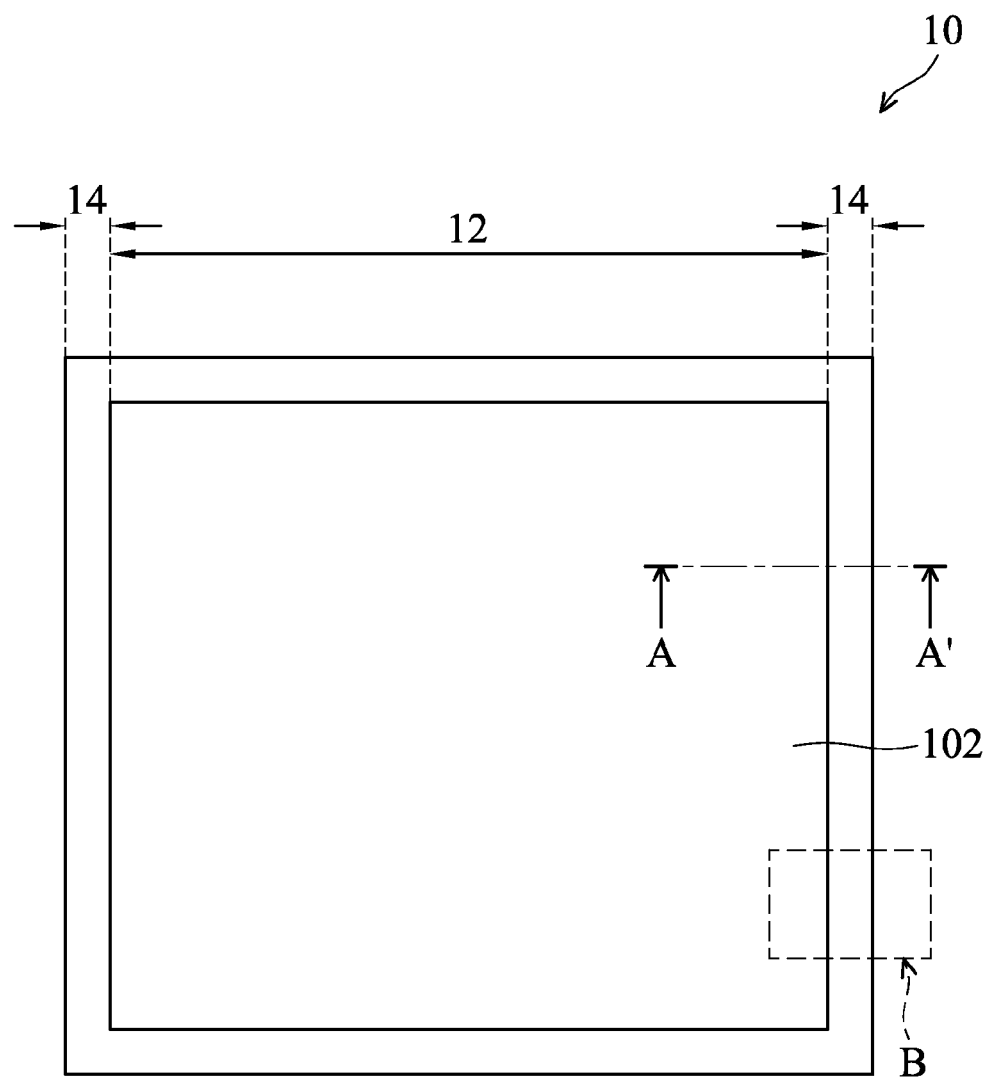
FIG. 1 shows a top-view representation of a semiconductor device structure, in accordance with some embodiments of the disclosure.

Embodiments for forming a semiconductor device structure are provided. FIG. 1 shows a top-view representation of a semiconductor device structure 10, in accordance with some embodiments of the disclosure. However, it should be noted that FIG. 1 has been simplified for the sake of clarity to better understand the inventive concepts of the disclosure. Additional features can be added to semiconductor device structure 10, and some of the features below can be replaced or eliminated.

Referring to FIG. 1, a substrate 102 is provided. Substrate 102 is silicon or a silicon-containing material. Substrate 102 is a high-resistance (high-R) substrate. In some embodiments, the substrate 102 has a resistance in a range from about 750 ohms-centimeter to 10000 ohms-centimeter. Substrate 102 has a device region 12 and an edge region 14. Edge region 14 surrounds device region 12.

Device region 12 may have various device elements. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes. In some embodiments, device region 12 is formed in substrate 102 in a front-end-of-line (FEOL) process.

FIGS. 2A-2F show cross-sectional representations of various stages of forming semiconductor device structure 10, in accordance with some embodiments of the disclosure.

Figure 2A:
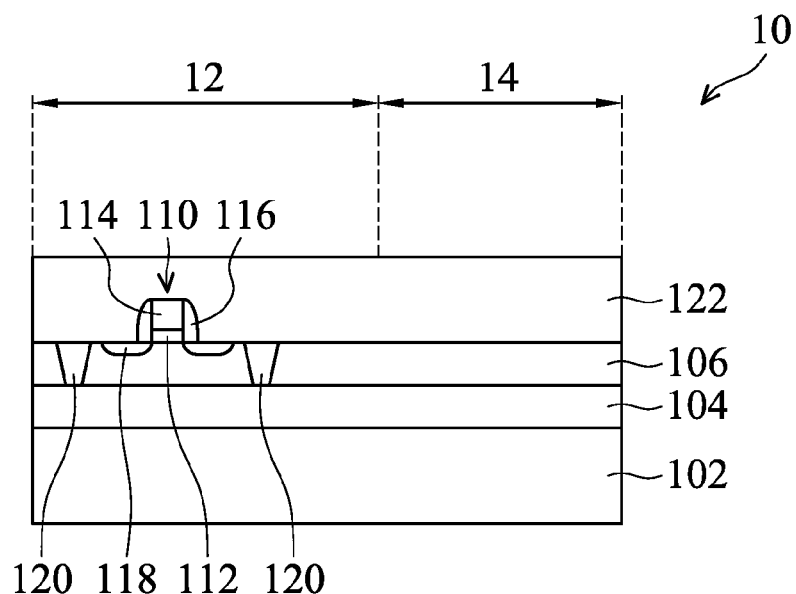
FIGS. 2A-2F show cross-sectional representations of various stages of forming a semiconductor device structure, in accordance with some embodiments of the disclosure.

Referring to FIG. 2A, an oxide layer 104 is formed on substrate 102. In some embodiments, a buried oxide layer is formed on substrate 102. Afterwards, a silicon layer 106 is formed on oxide layer 104. In some embodiments, a silicon-on-insulator (SOI) substrate is constructed by silicon layer 106 formed over oxide layer 104.

Silicon layer 106 may further include isolation features 120, such as shallow trench isolation (STI) features or local oxidation of silicon (LOCOS) features. The isolation features may define and isolate various integrated circuit devices.

As shown in FIG. 2A, a transistor 110 is formed on silicon layer 106 at device region 12. Transistor 110 includes a gate dielectric layer 112 and a gate electrode layer 114 formed on gate dielectric layer 112. The number of transistor 110 is not limited to one and may be changed according to the actual application.

Gate dielectric layer 112 may be made of silicon oxide, silicon oxynitride, or a high dielectric constant material (high-k material). The high dielectric constant material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or other suitable high-k dielectric materials. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or other suitable materials. Gate dielectric layer 112 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or other suitable processes.

Afterwards, gate electrode layer 114, made of a material, such as polysilicon, metal or metal silicide, is formed on the gate dielectric layer 112. In some embodiments, gate electrode layer 114 is made of a polysilicon layer which serves as a dummy gate that is replaced in a subsequent gate replacement process. In some embodiments, gate electrode layer 114 is formed using a CVD process.

Gate spacers 116 are formed on the opposite sidewalls of transistor 110. In some embodiments, a dielectric layer is deposited over semiconductor substrate 102, and an etching process is performed to remove a portion of the dielectric layer to form gate spacers 116. Gate spacers 116 are made of silicon oxide, silicon nitride, silicon oxynitride, and/or dielectric materials. Gate spacers 116 may include one layer or multiple layers.

As shown in FIG. 2, a source/drain region 118 is formed in silicon layer 106. In some embodiments, source/drain region 118 is doped with an n-type dopant, such as arsenic (As), phosphorous (P) or antimony (Sb). In some other embodiments, source/drain region 118 is doped with a p-type dopant, such as boron (B) or boron fluorine ($BF_2$). The doping may be achieved by an ion implantation process, plasma immersion ion implantation (PIII) process, gas and/or solid source diffusion process, or an other suitable process. Source/drain region 118 may further be exposed to annealing processes, such as a rapid thermal annealing process.

After transistor 110 is formed on silicon layer 106, an interlayer dielectric (ILD) layer 122 is formed on transistor 110 as shown in FIG. 2A in accordance with some embodiments of the disclosure.

ILD layer 122 is made of silicon oxide, doped or undoped silicon oxide, undoped silicate glass (USG), phosphorus-doped silicon glass (PSG), boron phosphorus silicate glass (BPSG), phenyl triethoxy silicate (PTEOS) or boron phosphorous tetraethyl silicate (BPTEOS). ILD 140 is formed by a chemical vapor deposition (CVD) process, high-density plasma CVD process (HDP CVD), spin coating or deposition furnace.

Figure 2B:
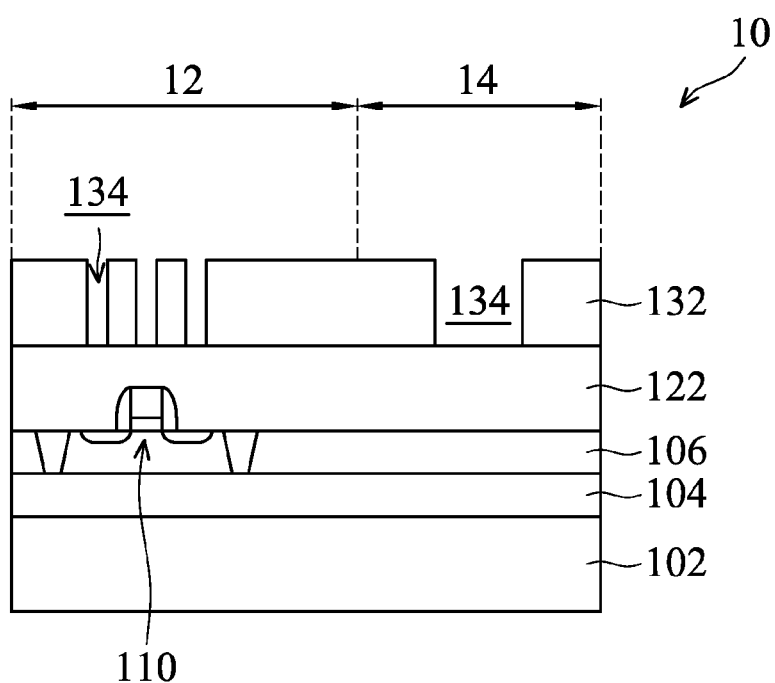

After ILD layer 122 is formed on transistor 110, a photoresist layer 132 is formed on ILD layer 122 as shown in FIG. 2B in accordance with some embodiments of the disclosure. Afterwards, photoresist layer 132 is patterned by a patterning process. The patterning process includes a photolithography process and an etching process. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process.

As shown in FIG. 2B, photoresist layer 132 has a number of openings 134. The shape of openings 134 may be adjusted according to application. In some embodiments, openings 134 have a shape that is a circle, rectangle, ellipse, square, or polygon when seen from a top view (not shown). It should be noted that although three openings 134 at device region 12 are illustrated in FIG. 2B, the number of openings 134 in photoresist layer 132 is not intended to be limiting.

Figure 2C:
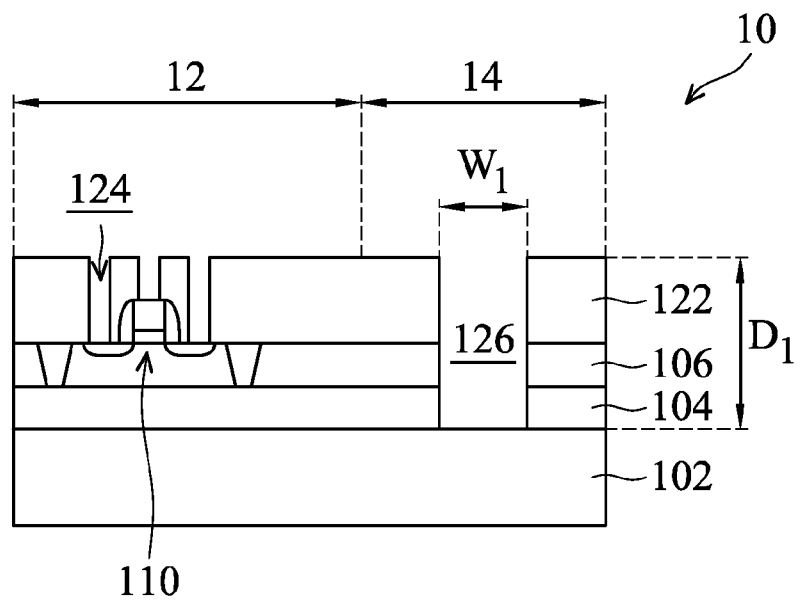

After photoresist layer 132 is formed, an etching process is performed to etch ILD layer 122 as shown in FIG. 2C in accordance with some embodiments of the disclosure. At device region 12, a portion of ILD layer 122 is removed by the etching process to form a number of via holes 124. At edge region 14, a portion of ILD layer 122, silicon layer 106 and oxide layer 104 are removed by the etching process to form a trench 126. The etching process may be a wet etching process or a dry etching process.

In some embodiments, trench 126 has a width $W_1$ in a range from about 0.1 μm to about 1 μm. In some embodiments, trench 126 has a depth $D_1$ in a range from about 0.6 μm to about 2 μm.

Figure 2D:
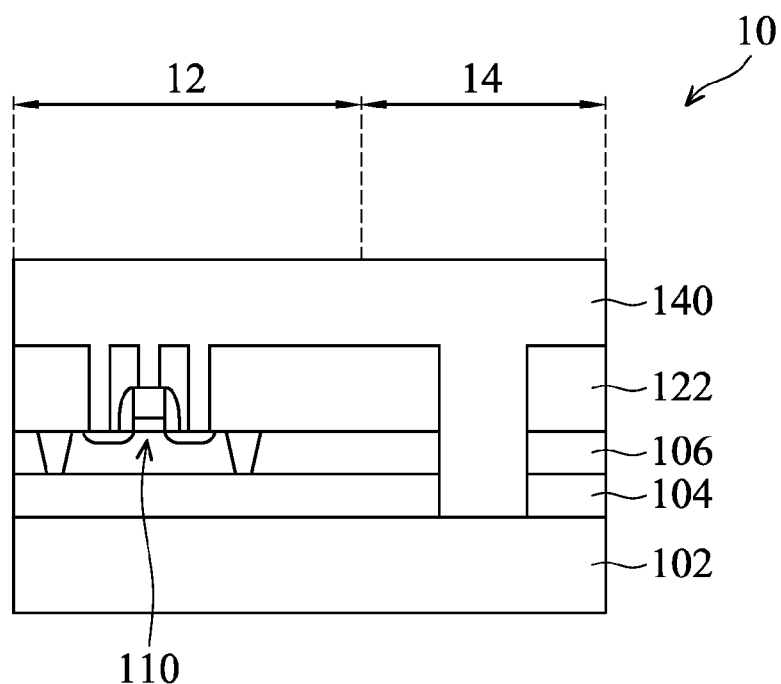

After trench 126 and via holes 124 are formed, photoresist layer 132 is removed. A conductive material 140 is filled into trench 126 and via holes 124 as shown in FIG. 2D in accordance with some embodiments of the disclosure.

Conductive material 140 may be made of metal or metal alloy. In some embodiments, conductive material 140 is made of tungsten (W), tungsten alloy, copper (Cu), copper alloy, alumina (Al), alumina alloy, or alumina copper alloy (AlCu). Conductive material 140 is formed by chemical vapor deposition (CVD), physical vapor deposition (PVD), atomic layer deposition (ALD), high density plasma CVD (HDPCVD), metal organic CVD (MOCVD), plasma enhanced CVD (PECVD), or other applicable deposition processes.

Figure 2E:
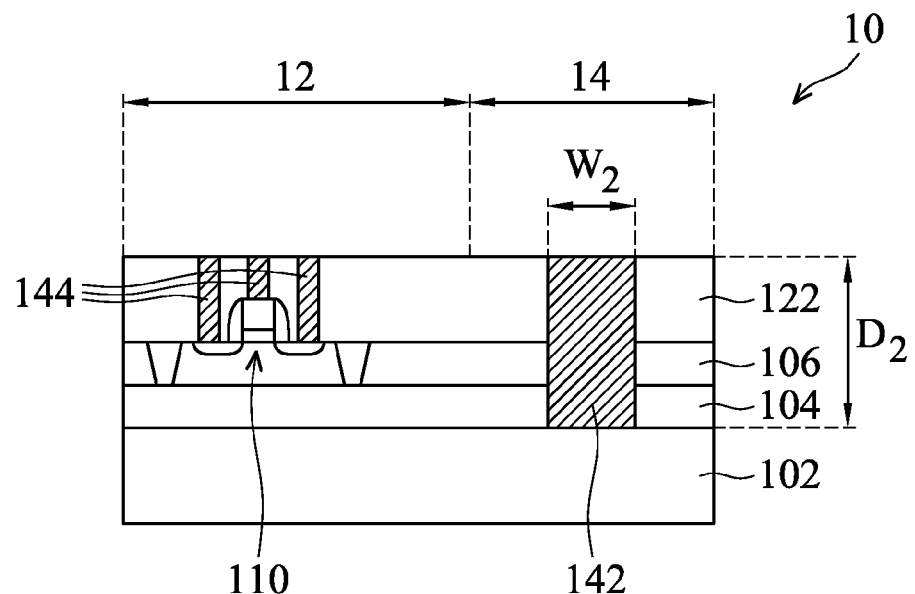

After conductive material 140 fills into trench 126 and via holes 124, excess portion of conductive material 140 is removed to expose a top surface of ILD layer 122 as shown in FIG. 2E in accordance with some embodiments of the disclosure. The excess portion of conductive material 140 may be removed by a planarization process. In some embodiments, the excess portion of conductive material 140 is removed by a chemical mechanical polishing (CMP) process.

A metal ring 142 is therefore formed in trench 126, and contact structures 144 are therefore formed in via holes 144. The top surface of metal ring 142 is therefore substantially level with the top surface of ILD layer 122. In addition, the top surface of contact structures 144 is substantially level with the top surface of metal ring 142.

The shape of metal ring 142 may be similar to or the same as the shape of trench 126. Therefore, although it is not shown in the cross-section representation illustrated in FIG. 2E, in some embodiments, metal ring 142 has a shape that is an enclosed circle, rectangle, ellipse, square, or polygon, when seen from a top view.

In addition, metal ring 142 and contact structures 144 may further include a liner and/or a barrier layer. For example, a liner (not shown) may be formed over the dielectric layer in the openings, and the liner covers the sidewalls and bottom of the opening. The liner may be either tetraethylorthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used.

The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like may, also be used.

As shown in FIG. 2E, transistor 110 is surrounded by metal ring 142. A portion of ILD layer 122 is also enclosed by metal ring 142. In some embodiments, oxide layer 104 is inserted between substrate 102 and silicon layer 106. During fabricating process for forming a semiconductor device structure 10, some charges easily accumulate in oxide layer 104. As a result, an arcing or a device-shifting problem may occur. In order to resolve the arcing problem or the device-shifting problem, metal ring 142 is formed to provide a conductive path to release the charges which are accumulated in oxide layer 104 of the SOI substrate.

In some embodiments, metal ring 142 has a width $W_2$ in a range from about 0.1 μm to about 1 μm. If the width $W_2$ of metal ring 142 is too small, metal ring 142 may not efficiently release the charges. If the width $W_2$ of metal ring 142 is too large, areas of device region 12 may be reduced because edge region 14 is larger. In some embodiments, metal ring 142 has a depth $D_2$ in a range from about 0.6 μm to about 2 μm.

It should be noted that metal ring 142 and contact structures 144 are made of the same material, and formed simultaneously. In other words, metal ring 142 is formed along with contact structures 144 without extra fabrication time and operations. As a result, fabrication time and cost are saved.

Figure 2F:
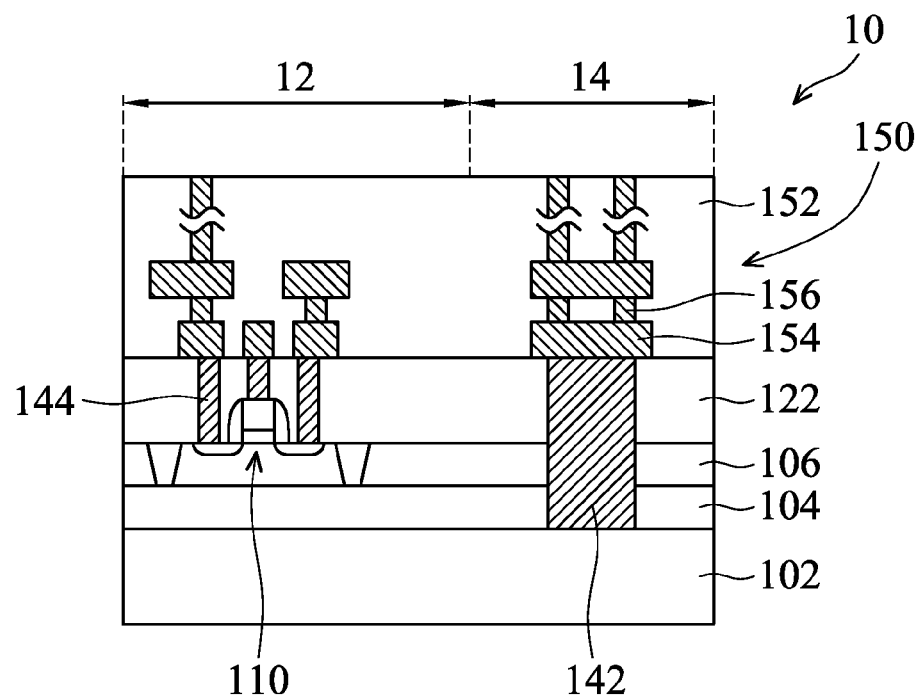

After metal ring 142 and contact structures 144 are formed, interconnection structure 150 is formed on metal ring 142, contact structures 144 and ILD layer 122 as shown in FIG. 2F in accordance with some embodiments of the disclosure. In some embodiments, interconnection structure 150 is embedded in inter-metal dielectric (IMD) layers 152. In some embodiments, inter-metal dielectric (IMD) layers 152 are made of silicon oxide, silicon nitride, silicon oxynitride, silicon carbide, BSG, BPSG, low-k or ultra low-k dielectrics.

Interconnection structure 150 is configured to couple the various p-type and n-type doped regions and the other functional features (such as gate electrodes), resulting a functional integrated circuit. In some embodiments, at device region 12, interconnection structure 150 is electrically connected to transistor 110, and at edge region 14, interconnection structure 150 is electrically connected to metal ring 142.

As shown in FIG. 2F, interconnection structure 150 includes first metal layer 154, and via features 156. In some embodiments, first metal layer 154 is the topmost metal layer and is called Mtop. First metal layer 154 provides horizontal electrical routing. The via features 156 provide vertical connection between metal lines in different metal layers.

In some embodiments, interconnection structure 150 is formed in a back-end-of-line (BEOL) process. First metal layer 154 may be made of conductive material, such as copper (Cu), copper alloy, aluminum (Al), aluminum alloy, tungsten (W), tungsten alloy, or other applicable materials. In some embodiments, first metal layer 154 is copper or copper alloy. In some embodiments, first metal layer 154 is formed by single and/or dual damascene processes.

It should be noted that interconnection structure 150 is electrically connected to substrate 102 by metal ring 142. Therefore, some charges that accumulate in oxide layer 104 and gate dielectric layer 112 at device region 12 are transferred through interconnection structure 150 to metal ring 142 and substrate 102. As a result, the arcing and the device-shifting problems are avoided.

Figure 3A:
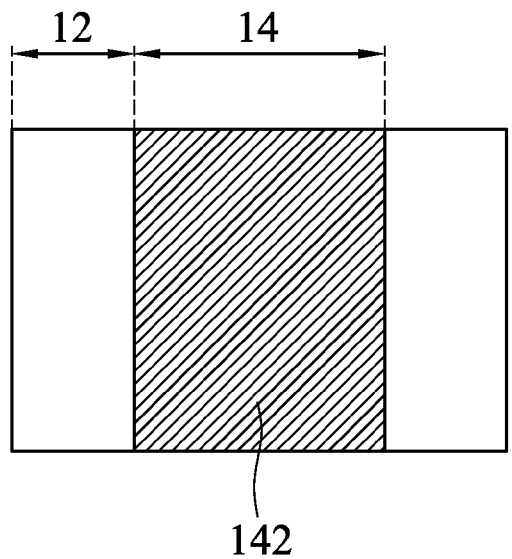
FIGS. 3A and 3B show top-view representations of a metal ring, in accordance with some embodiments of the disclosure.
Figure 3B:
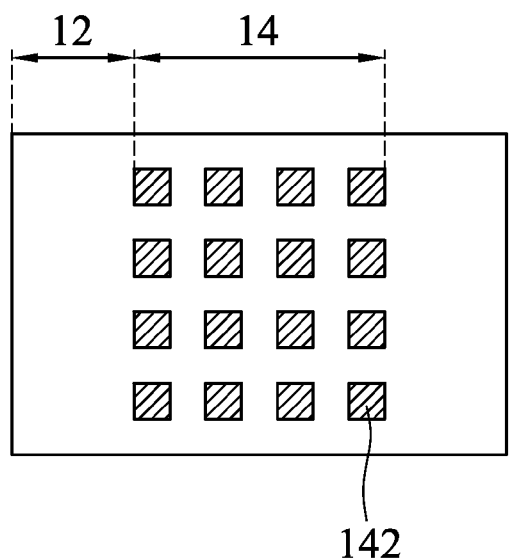

FIGS. 3A and 3B show top-view representations of a metal ring 142, in accordance with some embodiments of the disclosure. FIG. 3A shows an enlarged representation of a rectangle B of FIG. 1. Metal ring 142 has a continuous structure and a rectangular shape.

Alternatively, as shown in FIG. 3B, metal ring 142 has a non-continuous structure which is made of a number of vias which are arranged in an array.

Embodiments for forming a semiconductor device structure are provided. A transistor is formed at a device region of an SOI substrate, and a metal ring is formed at an edge region of the SOI substrate. The metal ring provides a conductive path to release the charges which are accumulated in an oxide layer of the SOI substrate. Therefore, the arcing and device-shifting problems are avoided. In addition, the formation of the metal ring is compatible with a CMOS fabricating process without extra fabrication time and operation. Therefore, fabricating time and cost are saved.

In some embodiments, a semiconductor device structure is provided. The semiconductor device structure includes a substrate, and the substrate has a device region and an edge region. The semiconductor device structure also includes a silicon layer formed on the substrate and a transistor formed on the silicon layer. The transistor is formed at the device region of the substrate. The semiconductor device structure further includes a metal ring formed in the silicon layer. The metal ring is formed at the edge region of the substrate, and the transistor is surrounded by the metal ring.

In some embodiments, a semiconductor device structure is provided. The semiconductor device structure includes a silicon-on-insulator (SOI) substrate and a silicon layer formed on the SOI substrate. The semiconductor device structure also includes a transistor formed on the silicon layer and an interlayer dielectric (ILD) layer formed on the transistor and the silicon layer. The semiconductor device structure further includes a metal ring formed on the substrate and through the ILD layer and the silicon layer. The metal ring surrounds the transistor and is configured to release the charges which accumulate in the SOI substrate.

In some embodiments, a method for forming a semiconductor device structure is provided. The method includes providing a substrate, and the substrate has a device region and an edge region. The method also includes forming a silicon layer on the substrate and forming a transistor on the silicon layer and at the device region. The method further includes forming a dielectric layer on the transistor and the silicon layer and forming a contact structure in the dielectric layer and at the device region. The contact structure is electrically connected to the transistor. The method also includes forming a metal ring through the dielectric layer and the silicon layer and at the edge region. The transistor is surrounded by the metal ring.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device structure, comprising:
a silicon substrate, wherein the silicon substrate has a device region and an edge region;
an oxide layer formed on the silicon substrate;
a silicon layer formed on the oxide layer;
a gate electrode layer formed on the silicon layer, wherein the gate electrode layer is formed at the device region of the silicon substrate;
a metal ring formed through the silicon layer and the oxide layer, wherein the metal ring is formed at the edge region of the silicon substrate, and the gate electrode layer is surrounded by the metal ring, and only a bottommost surface of the metal ring is in direct physical contact with a topmost surface of the silicon substrate;
an isolation structure formed in the silicon layer, wherein the silicon layer is formed between the isolation structure and the metal ring, and the metal ring does not physically contact the isolation structure; and
an interconnect structure formed over the metal ring, wherein the interconnect structure comprises:
a first metal layer formed on the metal ring; and
a plurality of via features formed on the first metal layer, wherein the plurality of via features are in direct physical contact with the first metal layer.

2. The semiconductor device structure as claimed in claim 1, wherein the interconnect structure is formed on the gate electrode layer and the metal ring.

3. The semiconductor device structure as claimed in claim 2, wherein the interconnect structure is electrically connected to the metal ring.

4. The semiconductor device structure as claimed in claim 1, further comprising:
a dielectric layer formed on the oxide layer, wherein the gate electrode layer is formed in the dielectric layer, and the metal ring is formed through the dielectric layer.

5. The semiconductor device structure as claimed in claim 1, wherein the metal ring has a continuous structure or non-continuous structure.

6. The semiconductor device structure as claimed in claim 1, wherein the metal ring has a depth in a range from about 0.6 μm to about 2 μm.

7. The semiconductor device structure as claimed in claim 1, wherein a sidewall of the metal ring is in direct physical contact with the silicon layer.

8. The semiconductor device structure as claimed in claim 1, wherein the metal ring is formed in a trench in the silicon layer, and the metal ring comprises a liner, a barrier layer on the liner and a metal material on the barrier layer, and the barrier layer is between the liner and the metal material.

9. The semiconductor device structure as claimed in claim 1, wherein the metal ring does not go through the silicon substrate.

10. A semiconductor device structure, comprising:
a substrate, wherein the substrate has a device region and an edge region;
an oxide layer formed on the substrate;
a silicon layer formed on the oxide layer;
a transistor formed on the substrate;
an interlayer dielectric (ILD) layer formed on the transistor and the silicon layer;
a metal ring formed on the substrate and through the ILD layer, the oxide layer and the silicon layer, wherein the metal ring surrounds the transistor and is configured to release charges which accumulate in the oxide layer, and only a bottommost surface of the metal ring is in direct physical contact with a topmost surface of the substrate, wherein the metal ring encircles the device region, wherein the metal ring is at four sides of the device region, the metal ring comprises a plurality of vias at each side of the device region, and the plurality of vias at each side of the device region are aligned with one another;
an isolation structure formed in the silicon layer, wherein the silicon layer is formed between the isolation structure and the metal ring; and
an interconnect structure formed over the metal ring, wherein the interconnect structure comprises:
a first metal layer formed on the metal ring; and
a plurality of via features formed on the first metal layer, wherein the plurality of via features are in direct physical contact with the first metal layer.

11. The semiconductor device structure as claimed in claim 10, further comprising:
a contact structure formed in the ILD layer, wherein the contact structure is electrically connected to a gate electrode layer of the transistor.

12. The semiconductor device structure as claimed in claim 10, wherein the metal ring is formed in a trench in the silicon layer, and the metal ring comprises a liner, a barrier layer on the liner and a metal material on the barrier layer, and the barrier layer is between the liner and the metal material.

13. The semiconductor device structure as claimed in claim 10, wherein the metal ring does not physically contact the isolation structure.

14. The semiconductor device structure as claimed in claim 10, wherein the substrate is a silicon substrate.

15. The semiconductor device structure as claimed in claim 10, wherein each of the plurality of vias at each side of the device region has a width which is smaller than a width of the edge region.

16. A semiconductor device structure, comprising:
- a silicon substrate, wherein the silicon substrate has a device region and an edge region;
- an oxide layer formed over the silicon substrate;
- a silicon layer formed over the oxide layer;
- a transistor formed on the silicon layer;
- an interlayer dielectric (ILD) layer formed on the transistor and the silicon layer;
- a metal ring formed on the silicon substrate and through the ILD layer, the oxide layer and the silicon layer, wherein the metal ring surrounds the transistor and is configured to release charges which accumulate in the oxide layer, and only a bottommost surface of the metal ring is in direct physical contact with a topmost surface of the silicon substrate; and
- an isolation structure formed in the silicon layer, wherein the silicon layer is formed between the isolation structure and the metal ring, wherein the metal ring encircles the device region, wherein the metal ring is at four sides of the device region, the metal ring comprises a plurality of vias at each side of the device region, and the plurality of vias at each side of the device region are aligned with one another.

17. The semiconductor device structure as claimed in claim 16, wherein the metal ring is formed in a trench in the silicon layer, and the metal ring comprises a liner, a barrier layer on the liner and a metal material on the barrier layer, and the barrier layer is between the liner and the metal material.

18. The semiconductor device structure as claimed in claim 16, wherein the metal ring does not physically contact the isolation structure.

* * * * *